US006548937B1

(12) United States Patent
Klee et al.

(10) Patent No.: US 6,548,937 B1
(45) Date of Patent: Apr. 15, 2003

(54) ARRAY OF MEMBRANE ULTRASOUND TRANSDUCERS

(75) Inventors: Mareike Katharine Klee, Hueckelhoven (DE); Hans-Wolfgang Brand, Aachen (DE); Egon Krafczyk, Aachen (DE); Hans-Peter Loebl, Monschau-Imgenbroich (DE); Peter Klaus Bachmann, Wuerselen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/137,492

(22) Filed: May 1, 2002

(51) Int. Cl.$^{7}$ .............................................. H01L 41/08

(52) U.S. Cl. ....................................................... 310/324

(58) Field of Search ....................... 310/324; 331/108 C, 331/116 R, 158

(56) References Cited

U.S. PATENT DOCUMENTS

| | | | | |
|---|---|---|---|---|
| 5,075,641 | A | * 12/1991 | Weber et al. | 331/108 C |
| 5,433,917 | A | 7/1995 | Srivastava et al. | 419/22 |
| 5,619,476 | A | 4/1997 | Haller et al. | 367/181 |
| 5,656,382 | A | * 8/1997 | Nashimoto | 428/620 |
| 5,814,920 | A | * 9/1998 | Takeuchi et al. | 310/330 |
| 5,870,351 | A | 2/1999 | Ladabaum et al. | 367/163 |
| 5,894,452 | A | 4/1999 | Ladabaum et al. | 367/163 |
| 6,291,927 | B1 | 9/2001 | Percin et al. | 310/324 |
| 2002/0008443 | A1 | * 1/2002 | Yamada et al. | 310/324 |

FOREIGN PATENT DOCUMENTS

| | | | | |
|---|---|---|---|---|
| JP | 2001-196896 | * 7/2001 | ............ | H03H/9/25 |

OTHER PUBLICATIONS

Jin et al., "Fabrication and Characterization of Surface Micromachined Capacitive Ultrasonic Immersion Transducers," IEEE Journ. of Microelec., vol. 8, No. 1, Mar. 1999, pp. 100–114.

Percin et al., "Micromachined 2–D Array Piezoelectrically Actuated Flextensional Transducers," IEEE Ultrasonics Symposium, pp. 959–962, 08/97.

Bernstein et al., "Advanced MEMS Ferroelectric Ultrasound 2D Arrays," IEEE Ultrasonics Symposium, pp. 1145–1153, 1/99.

Percin et al., "Piezoelectrically Actuated Transducer and Droplet Ejector," IEEE Ultrasonics Symposium, pp. 913–916, 1/96.

* cited by examiner

*Primary Examiner*—Thomas M. Dougherty
(74) *Attorney, Agent, or Firm*—W. Brinton Yorks, Jr.

(57) ABSTRACT

The invention relates to an array of ultrasound transducers which each comprise a membrane that is comprised of diamond or diamond-like carbon, a barrier structure, a piezoelectric layer, a first electrode and a second electrode. The barrier structure ensures strong adhesion of the piezoelectric layer to the barrier structure and thus to the device and that the piezoelectric layer only comprises a single phase. In addition, the barrier structure protects the membrane against oxidation/decomposition during the manufacturing process of piezoelectric layer. The invention further relates to an ultrasound transducer.

5 Claims, 1 Drawing Sheet

ARRAY OF MEMBRANE ULTRASOUND TRANSDUCERS

Figure 1:
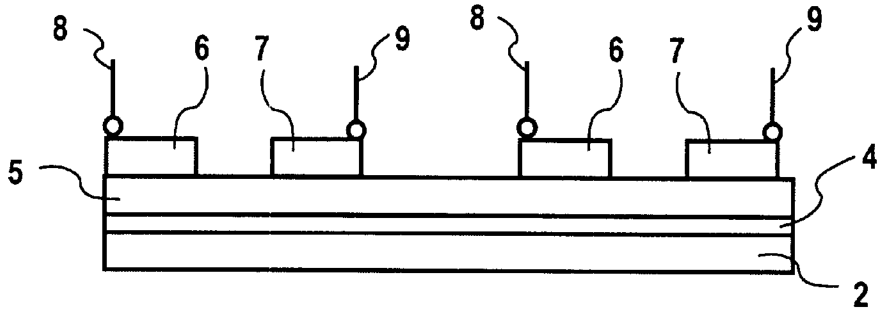

This invention relates to the field of ultrasound transducers and more particularly to ultrasound membrane transducers which comprise a membrane that is comprised of a diamond or diamond-like carbon layer.

The generation of ultrasonic sound takes place by purely mechanical means or by means of electroacoustic transducers which utilize the magnetostrictive or piezoelectric effect. Since ultrasound can be easily realized technically nowadays, it is widely used. Thus ultrasound is used for generating images in medical diagnostics or in non-destructive material testing.

The electroacoustical transducers used most widely are based on the piezoelectric effect. In practice, one-dimensional or two-dimensional array systems are mostly used in addition to single-transducer systems. Two-dimensional array systems are particularly interesting for the display of three-dimensional images.

The excitation of the piezoelectric elements in acoustic transducers takes place either in an AC field with a frequency of a few kHz up to several MHz or, in particular in image generation, by short oscillation bursts with a basic frequency of a few MHz and relative bandwidths of up to 100%. The excursion of the piezoelectric elements in the field direction generates a continuous or pulsatory ultrasound wave in the coupled medium such as, for example, water or biological tissue. The reflections changing in dependence on the tissue density and the throughput times changing with the path length are utilized for image generation in medical diagnostics.

In an array of ultrasound transducers each transducer may comprise a membrane on which a piezoelectric layer and on top of the piezoelectric layer a first and a second electrode are provided. The change in length of the piezoelectric element excites the membrane into oscillation.

An array of ultrasonic membrane transducers may be formed as so-called piezoelectric micromachined ultrasound transducers (PMUT). The array of piezoelectric ultrasound transducers is provided directly on silicon. Such an ultrasound transducer may comprise besides a silicon substrate a membrane on which a piezoelectric layer and on top of the piezoelectric layer a first and a second electrode are provided. The membrane can be obtained simply through etching away of the silicon so that an opening is created. The change in length of the piezoelectric element excites the membrane into oscillation. To manufacture an array of such ultrasound transducers, several openings are generated for the creation of several membranes on one silicon substrate.

Diamond is a preferred material for acoustic wave devices since it exhibits properties which are superior to conventional acoustic wave materials. Diamond possesses a combination of properties such as a low coefficient of thermal expansion, high mechanical hardness, large thermal conductivity, and high Young's modulus, that are uniquely suited for acoustic applications.

Due to its above mentioned properties diamond is used as membrane material in ultrasound transducers.

A piezoelectric layer may be manufactured by depositing the piezoelectric material in a spray process, in a spin process, in a dip process, in a chemical vapor deposition process, in a sputter process or a laser ablation process. The deposition temperatures for all these processes lie between 500° C.and 800° C. depending on the composition of the piezoelectric material. In addition, all processes are carried out in the presence of oxygen in order to improve crystallization of the piezoelectric material.

These rigid process conditions may lead to partial decomposition of a membrane that is comprised of diamond and thus to significantly reduced adhesion of the piezoelectric layer on the surface of the membrane.

Another problem occurs due to the fact that the hydrophobility of the diamond surface differs depending on the manufacturing conditions of the membrane. This makes it more difficult to manufacture a piezoelectric layer with good and strong adhesion to a membrane that is comprised of diamond.

In addition, the structure and the morphology of the piezoelectric layer is influenced by a membrane that is comprised of diamond. It has been noted that often instead of a single phase piezoelectric layer a second phase containing pyrochlor is obtained when depositing a piezoelectric material on a diamond substrate.

It is accordingly an object of the present invention to provide an improved ultrasound transducer which comprises a membrane that is comprised of diamond or diamond-like carbon and a piezoelectric layer which shows good and strong adhesion to the other layers/components of the ultrasound transducer.

This object is achieved by means of an array of ultrasound transducers which each comprise a membrane that is comprised of diamond or diamond-like carbon, a barrier structure, a piezoelectric layer, and a first and a second electrode disposed on the same surface of the piezoelectric layer. In a preferred embodiment the barrier structure comprises at least one layer of an oxide selected from the group of $TiO_2$, MgO, $Al_2O_3$, $HfO_2$, $ZrTiO_4$, $LaAlO_3$ and any combination of these compounds.

The barrier structure prevents decomposition of the membrane that is comprised of diamond or diamond-like carbon during the deposition of the piezoelectric layer. In addition, the barrier structure ensures that a single phase piezoelectric layer is obtained when depositing the piezoelectric material on the barrier structure instead of directly onto the membrane. Another advantage is that adhesion between a piezoelectric layer and such a barrier structure is stronger than the adhesion between a piezoelectric layer and a membrane that is comprised of diamond or diamond-like carbon.

In accordance with a described embodiment, an array of ultrasound transducers is obtained in which the piezoelectric layer strongly adheres to the lower barrier structure, in which the piezoelectric layer shows a single phase and in which the membrane is not affected by the rigid process conditions when manufacturing the piezoelectric layer.

According to a preferred embodiment an array of ultrasound transducers may be comprised of micromachined ultrasound transducers.

The invention also relates to an ultrasound transducer which comprises a membrane that is comprised of diamond or diamond-like carbon, a barrier structure, a piezoelectric layer, and a first and a second electrode disposed on the same surface of the piezoelectric layer, wherein the barrier structure comprises at least one layer of an oxide selected from the group of $TiO_2$, MgO, $Al_2O_3$, $HfO_2$, $ZrTiO_4$, $LaAlO_3$ and any combination of these compounds.

Figure 2:
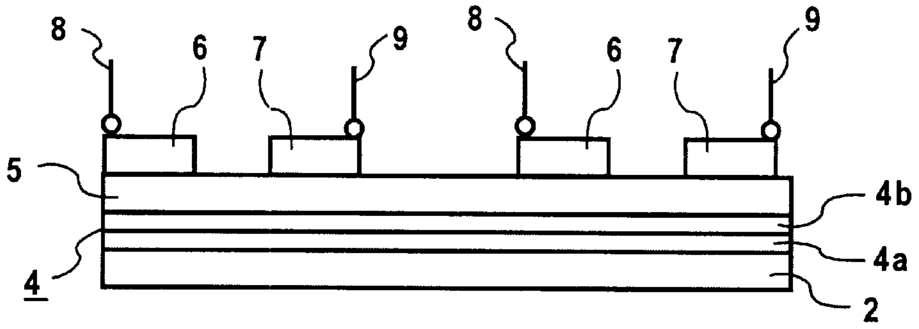
Figure 3:
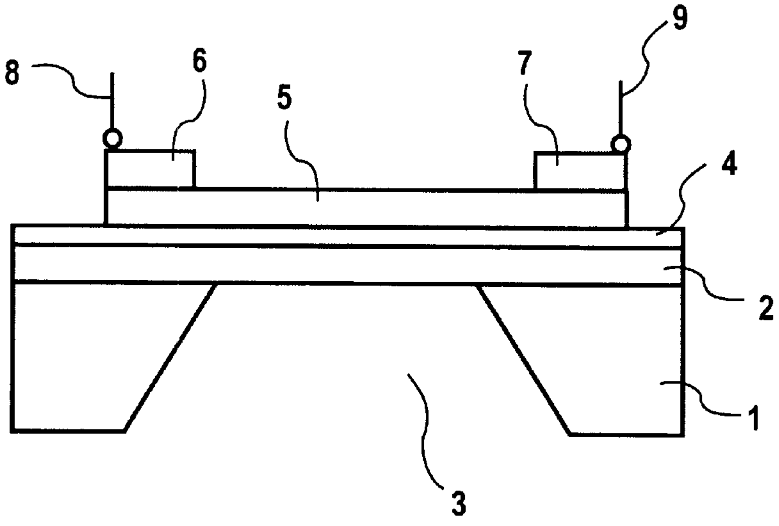

The invention will be explained in more detail below with reference to three drawings and four embodiments. In the drawings:

FIG. 1 shows the construction of an array ultrasound transducer in cross-section, FIG. 2 shows the construction of an further array ultrasound transducer in cross-section, and FIG. 3 shows the construction of a micromachined ultrasound transducer in cross-section.

In FIG. 1, an embodiment of an array of ultrasound transducer comprises a membrane 2, which comprises diamond or diamond-like carbon. A membrane 2 that is comprised of diamond or diamond-like carbon may be manufactured by Chemical Vapor Deposition (CVD). It may be preferred that the membrane 2 has a thickness between one and two $\mu$m. A barrier structure 4 is provided on the membrane 2. In this embodiment barrier structure 4 comprises a single layer of $TiO_2$, MgO, $Al_2O_3$, $HfO_2$, $ZrTiO_4$, $LaAlO_3$ or any combination of these compounds. The thickness of the barrier structure 4 lies preferably between 30 and 300 nm. The barrier structure 4 ensures strong adhesion of the piezoelectric layer 5 to the barrier structure 4 and thus to the device. It also ensures that the piezoelectric layer 5 only comprises a single phase. In addition, barrier structure 4 protects membrane 2 against oxidation/decomposition during the manufacturing process of piezoelectric layer 5.

A piezoelectric layer 5 is provided on the barrier structure 4. The layer thickness of the piezoelectric layer 5 preferably lies between 1 and 50 $\mu$m. To achieve higher bandwidths, materials with a high piezoelectric coupling coefficient k are used in the piezoelectric layer 5. Materials which may be used for the piezoelectric layer 5 are, for example, ferroelectric materials, electrostrictive materials, as well as special piezoelectric materials. Thus, for example, the piezoelectric material is selected from the group consisting of lead titanate (PT) that may be doped with La, Mn, Fe, Sb, Sr, or Ni or any combination of these elements, lead zirconate titanate (PZT) that may be doped with La, Mn, Fe, Sb, Sr, or Ni or any combination of these elements, polyvinylidene fluoride polymer (PVDF), $Pb(Ni_{1/3}Nb_{2/3})O_3$—$PbTiO_3$, $Pb(Sc_{1/2}Nb_{1/2})O_3$—$PbTiO_3$, $Pb(Zn_{1/3}Nb_{2/3})_{1-x-y}(Mn_{1/2}Nb_{1/2})_xTi_yO_3$, where ($0 \leqq x \leqq 1$) and ($0 \leqq y \leqq 1$), $Pb(In_{1/2}Nb_{1/2})O_3$—$PbTiO_3$, $Pb(Y_{1/2}Nb_{1/2})O_3$—$PbTiO_3$, $Pb(Zn_{1/3}Nb_{1/3})O_3$—$PbTiO_3$ that may be doped with La, Mn, Fe, Sb, Sr, or Ni or any combination of these elements, $Pb(Mg_{1/2}Nb_{2/3})O_3$—$PbTiO_3$ that may be doped with La, Mn, Fe, Sb, Sr, or Ni or any combination of these elements, $Sr_3TaGa_3Si_2O_{14}$, $K(Sr_{1-x}Ba_x)_2Nb_5O_{15}$, where ($0 \leqq x \leqq 1$), $Na(Sr_{1-x}Ba_x)_2Nb_5O_{15}$ where ($0 \leqq x \leqq 1$), $BaTiO_3$, $(K_{1-x}Na_x)NbO_3$ where ($0 \leqq x \leqq 1$), (Bi,Na,K,Pb,Ba)$TiO_3$, (Bi,Na)$TiO_3$, $Bi_7Ti_4NbO_{21}$, $(K_{1-x}Na_x)NbO_3$—(Bi,Na,K,Pb,Ba)$TiO_3$ where ($0 \leqq x \leqq 1$), $a(Bi_xNa_{1-x})TiO_{3-b}(KNbO_{3-c})1/2(Bi_2O_3$—$Sc_2O_3)$ where ($0 \leqq x \leqq 1$) and (a+b+c=1), $(Ba_aSr_bCa_c)Ti_xZr_{1-x}O_3$ where ($0 \leqq x \leqq 1$) and (a+b+c=1), $(Ba_aSr_bLa_c)Bi_4Ti_4O_{15}$ where (a+b+c=1), $Bi_4Ti_3O_{12}$, $LiNbO_3$, $La_3Ga_{5.5}NB_{0.5}O_{14}$, $La_3Ga_5SiO_{14}$, $La_3Ga_{5.5}Ta_{0.5}O_{14}$, AIN and ZnO. It may be advantageous that the piezoelectric layer 5 is a single crystal layer or a textured layer.

A plurality of spaced-apart first and second electrodes 6, 7 are attached to the piezoelectric layer 5, for laterally poled operation of the piezoelectric layer 5, which electrodes 6,7 comprise a conductive material, which may include a Ti or $Ti_{1-x}W_x$ where ($0 \leqq x \leqq 1$) alloy interface layer and a conductive layer of aluminum, aluminum doped with silicon or aluminum doped with copper, gold, platinum although other conductive materials may also be used.

The application of an AC voltage to the electrodes 6, 7 through the first and second current supply contacts 8, 9 causes the piezoelectric layer 5 to be excited into a longitudinal oscillation in the plane of the layer. The first and second current supply contacts 8, 9 may be embedded in an acoustic backing member. The acoustic backing member may be comprised of any suitable material having relatively high acoustic attenuation and appropriately selected low acoustic impedance that also provides a relatively rigid structural support for the membrane 2, the first electrodes 6 and second electrodes 7.

FIG. 2 shows another embodiment of the invention. In this embodiment the barrier structure 4 is a layered structure with two layers. The first layer 4*a* of the layered structure which adjoins the membrane 2 may comprise SiN(H), $Si_3N_4$, $SiO_2$, $Si_xO_yN_z$ ($0 \leqq x \leqq 1$, $0 \leqq y \leqq 1$, $0 \leqq z \leqq 1$), AIN, or $Al_2O_3$ or any combination of these compounds. The second layer 4*b* may comprise $TiO_2$, MgO, $Al_2O_3$, $HfO_2$, $ZrTiO_3$, $LaAlO_3$ or any combination of these compounds. In such an embodiment the first layer 4*a* functions as oxygen diffusion barrier when depositing the piezoelectric material in an oxygencontaining atmosphere during the manufacturing process of the piezoelectric layer 5. Thus the first layer 4*a* prevents oxidation/decomposition of the membrane 2 that is comprised of diamond or diamond-like carbon. The second layer 4*b* of the layered structure chemically isolates the first layer 4*a* from the piezoelectric layer 5 which otherwise will react with each other. Alternatively, the barrier structure 4 may comprise more layers which are located between the first layer 4*a* and the second layer 4*b*.

In FIG. 3, an embodiment of a micro-machined ultrasound transducer comprises a substrate 1 which may comprise, for example, silicon, silicon with (100) orientation or (111) orientation, MgO with (100) orientation, $LaAlO_3$, sapphire, GaAs, ceramic materials such as, for example, $ZrO_2$ or $Al_2O_3$, ceramic materials such as, for example, $ZrO_2$ or $Al_2O_3$ each with a planarizing layer, glass-ceramic materials, or glass materials. Most preferred the substrate 1 comprises silicon. A membrane 2, which comprises diamond or diamond-like carbon, is provided on the substrate 1. It may be preferred that the membrane 2 has thickness between one and two $\mu$m. At least one opening 3 is created in the substrate 1 by means of etching or stamping. The opening 3 adjoins the membrane 2 at one side. The membrane 2 present on the opening 3 is capable of oscillating thanks to this opening 3.

A barrier structure 4 is provided on the membrane 3. In this embodiment barrier structure 4 comprises a single layer of $TiO_2$, MgO, $Al_2O_3$, $HfO_2$, $ZrTiO_4$, $LaAlO_3$ or any combination of these compounds. The thickness of the barrier structure 4 lies preferably between 30 and 300 nm. The barrier structure 4 ensures strong adhesion of the piezoelectric layer 5 to the barrier structure 4 and thus to the device. It also ensures that the piezoelectric layer 5 only comprises a single phase. In addition, barrier structure 4 protects membrane 2 against oxidation/decomposition during the manufacturing process of piezoelectric layer 5.

A piezoelectric layer 5 is provided on the barrier structure 4. The layer thickness of the piezoelectric layer 5 preferably lies between 1 and 50 $\mu$m. To achieve higher bandwidths, materials with a high piezoelectric coupling coefficient k are used in the piezoelectric layer 5. Materials which may be used for the piezoelectric layer 5 are, for example, ferroelectric materials, electrostrictive materials, as well as special piezoelectric materials.

A first and a second electrode 6, 7 are disposed at laterally opposite ends of the piezoelectric layer 5, for laterally poled operation of the piezoelectric layer 5, which electrodes 6,7 comprise a conductive material, which may include a Ti or $Ti_{1-x}W_x$ where ($0 \leqq x \leqq 1$) alloy interface layer and a conductive layer of aluminum, aluminum doped with silicon or aluminum doped with copper, gold, platinum although other conductive materials may also be used.

It may be desirable to form the electrodes 6,7 as concentric rings.

The application of an AC voltage to the electrodes 6, 7 through the first and second current supply contacts 8, 9 causes the piezoelectric layer 5 to be excited into a longitudinal oscillation in the plane of the layer.

Additional electrodes may be laterally dispersed between the ends of the piezoelectric layer 5 to decrease the electrical impedance of the transducer. For instance, four electrodes may be formed at discrete locations across a lateral surface of the piezoelectric layer 5, with alternate electrodes being of alternate polarity and electrodes of the same polarity being coupled in parallel for reduced electrical impedance.

A plurality of such ultrasound transducers may be provided on a substrate 1. A one-dimensional or two-dimensional array of ultrasound transducers can be manufactured through a suitable electrical connection of the individual ultrasound transducers. The piezoelectric layer 5, the first and second electrodes 6, 7, are structured in such a manner in this case that the individual ultrasound transducers are spatially separated from one another.

Substrate 1 may comprise on its rear side an insulating layer of $SiO_2$ or $Si_3N_4$ or a combination of these materials.

Alternatives in the construction of an array of ultrasound transducers or one ultrasound transducer and in the shaping of the various layers and/or the opening 3 are familiar to those skilled in the art. In addition, the array may also comprise separation means which electrically and acoustically decouple an ultrasound transducer from other adjacent ultrasound transducers.

Embodiments of the invention will be explained in more detail below, representing examples of how the invention may be realized in practice.

Embodiment 1

A barrier structure 4 of $TiO_2$ having a layer thickness of 30 nm is provided on a membrane 2 composed of diamond and having a thickness of 1 μm. A layer of $PbZr_{0.35}TiO_{0.65}O_3$ is provided by a spin process in an oxygen-containing atmosphere on the barrier structure 4 so as to form the piezoelectric layer 5. The piezoelectric layer 5 has a layer thickness of 1.0 μm. A plurality of spaced-apart first electrodes 6 and second electrode 7 are disposed on the piezoelectric layer 5. The electrodes 6,7 are composed of $Ti_{0.9}W_{0.1}$/Al/Ti/Au. The first and second electrodes 6, 7 of each ultrasound transducer are connected to a first and second current supply contact 8, 9, respectively. The individual ultrasound transducers are electrically connected such that a one-dimensional array of ultrasound transducers is obtained.

Embodiment 2

A barrier structure 4 is provided on a membrane 2 composed of diamond and having a thickness of 1 μm. A layer of $PbZr_{0.35}Ti_{0.65}O_3$ is provided by a spin process in an oxygen-containing atmosphere on the barrier structure 4 so as to form the piezoelectric layer 5. The piezoelectric layer 5 has a layer thickness of 1.0 μm. A plurality of spaced-apart first electrodes 6 and a second electrode 7 are disposed on the piezoelectric layer 5. The electrodes 6,7 were composed of $Ti_{0.9}W_{0.1}$/Al/Ti/Au. The first and second electrodes 6, 7 of each ultrasound transducer are connected to a first and second current supply contact 8, 9, respectively. The barrier structure 4 is a layered structure comprising a first layer **4*a* composed of SiN(H) and a second layer 4*b* composed of $TiO_2$. The first layer 4*a* has a layer thickness of about 50 nm and the second layer 4*b* has a layer thickness of about 30 nm. A layer of $PbZr_{0.35}Ti_{0.65}O_3$ is provided by a spin process in an oxygen-containing atmosphere on the second layer 4*b* of barrier structure 4 so as to form the piezoelectric layer 5. A plurality of spaced-apart first electrodes 6 and second electrode 7 are disposed on the piezoelectric layer 5. The electrodes 6,7 are composed of $Ti_{0.9}W_{0.1}$/Al/Ti/Au. The first and second electrodes 6, 7 of each ultrasound transducer are connected to a first and second current supply contact 8, 9**, respectively. The individual ultrasound transducers are electrically connected such that a one-dimensional array of ultrasound transducers is obtained.

Embodiment 3

A barrier structure 4 is provided on a membrane 2 composed of diamond and having a thickness of 1 μm. A layer of $PbZr_{0.35}Ti_{0.65}O_3$ is provided by a spin process in an oxygen-containing atmosphere on the barrier structure 4 so as to form the piezoelectric layer 5. The piezoelectric layer 5 had a layer thickness of 1.0 μm. A plurality of spaced-apart first electrodes 6 and second electrode 7 are disposed on the piezoelectric layer 5. The electrodes 6,7 are composed of $Ti_{0.9}W_{0.1}$/Al/Ti/Au. The first and second electrodes 6, 7 of each ultrasound transducer are connected to a first and second current supply contact 8, 9, respectively. The barrier structure 4 is a layered structure comprising a first layer **4*a* composed of SiN(H), a second layer 4*b* composed of $TiO_2$ and an intermediate layer composed of $SiO_2$ sandwiched between first layer 4*a* and second layer 4*b*. The first layer 4*a* has a layer thickness of about 50 nm, the second layer 4*b* has a layer thickness of about 30 nm and the intermediate layer has a layer thickness of about 50 nm. A layer of $PbZr_{0.35}Ti_{0.65}O_3$ is provided by a spin process in an oxygen-containing atmosphere on the second layer 4*b* of barrier structure 4 so as to form the piezoelectric layer 5. A plurality of spaced-apart first electrodes 6 and second electrode 7 are disposed on the piezoelectric layer 5. The electrodes 6,7 were composed of $Ti_{0.9}W_{0.1}$/Al/Ti/Au. The first and second electrodes 6, 7 of each ultrasound transducer are connected to a first and second current supply contact 8, 9**, respectively. The individual ultrasound transducers are electrically connected such that a one-dimensional array of ultrasound transducers is obtained.

Embodiment 4

An array of ultrasound transducers comprises a silicon substrate 1 which has an insulating layer of $Si_3N_4$ on one side. On the opposite side, a membrane 2 composed of diamond having a thickness of 1 μm is provided. The substrate 1 has a plurality of openings 3 which each adjoin the membrane 2 at one side. A barrier structure 4 is present on the membrane 2. The barrier structure 4 is a layered structure comprising a first layer **4*a* composed of $SiO_2$ and a second layer 4*b* composed of $TiO_2$. The first layer 4*a* has a layer thickness of about 50 nm and the second layer 4*b* had a layer thickness of about 50 nm. A layer of $PbZr_{0.35}Ti_{0.65}O_3$ is provided by a spin process in an oxygencontaining atmosphere on the second layer 4*b* of barrier structure 4 so as to form the piezoelectric layer 5. A plurality of spaced-apart first electrodes 6 and second electrode 7 are disposed on the piezoelectric layer 5. The electrodes 6,7 are composed of $Ti_{0.9}W_{0.1}$/Al/Ti/Au. The first and second electrodes 6, 7 of each ultrasound transducer are connected to a first and second current supply contact 8, 9, respectively. The individual ultrasound transducers are electrically connected on the substrate 1** such that a one-dimensional array of ultrasound transducers is obtained.

What is claimed is:

1. An array of ultrasound transducers which each comprise a membrane (2) that is comprised of diamond or diamond-like carbon, a barrier structure (4), a piezoelectric layer (5), and a first and a second electrode (6,7) disposed on the same surface of the piezoelectric layer (5), wherein said barrier structure (4) comprises at least one layer of an oxide selected from the group of $TiO_2$, MgO, $Al_2O_3$, $HfO_2$, $ZrTiO_3$, $LaAlO_3$ and any combination of these compounds.

2. An array of ultrasound transducers as claimed in claim 1, characterized in that the barrier structure (4) is a layered structure that includes at least a first layer (4*a*) which adjoins the membrane (2) and at least a second layer (4*b*) which adjoins the piezoelectric layer (5) and wherein the second layer (4*b*) comprises an oxide selected from the group of $TiO_2$, MgO, $Al_2O_3$, $HfO_2$, $ZrTiO_4$, $LaAlO_3$ and any combination of these compounds.

3. An array of ultrasound transducers as claimed in claim 2, characterized in that the first layer (4*a*) which adjoins the membrane (2) comprises a material selected from group of SiN(H), $Si_3N_4$, $SiO_2$, $Si_xO_yN_z$ ($0 \leqq x \leqq 1$, $0 \leqq y \leqq 1$, $0 \leqq z \leqq 1$), AlN, $Al_2O_3$ and any combination of these compounds.

4. An array of ultrasound transducers as claimed in claim 1, characterized in that each ultrasound transducer comprises a substrate (1), said substrate (1) comprising at least one opening (3) which adjoins the membrane (2) at one side.

5. An ultrasound transducers which comprises a membrane (2) that is comprised diamond or diamond-like carbon, a barrier structure (4), a piezoelectric layer (5), and a first and a second electrode (6,7) disposed on the same surface of the piezoelectric layer (5), wherein said barrier structure (4) comprises at least one layer of an oxide selected from the group of $TiO_2$, MgO, $Al_2O_3$, $HfO_2$, $ZrTiO_4$, $LaAlO_3$ and any combination of these compounds.

* * * * *